United States Patent
Filippi et al.

(10) Patent No.: US 8,349,723 B2
(45) Date of Patent: Jan. 8, 2013

(54) STRUCTURE OF POWER GRID FOR SEMICONDUCTOR DEVICES AND METHOD OF MAKING THE SAME

(75) Inventors: Ronald Filippi, Hopewell Junction, NY (US); Wai-kin Li, Hopewell Junction, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/342,221

(22) Filed: Jan. 3, 2012

(65) Prior Publication Data

US 2012/0100712 A1     Apr. 26, 2012

Related U.S. Application Data

(62) Division of application No. 12/491,372, filed on Jun. 25, 2009.

(51) Int. Cl.
 *H01L 21/4763* (2006.01)

(52) U.S. Cl. ........ 438/622; 438/672; 438/637; 438/639; 257/751; 257/774; 257/758

(58) Field of Classification Search .................. 438/627, 438/643, 653, 629, 637, 638, 639, 640, 667, 438/675, 700, 672, 673, 701, 978, 622, 618; 257/750, 751, 752, 774, 775, 776, 758, 700, 257/690, 686

See application file for complete search history.

(56) References Cited

U.S. PATENT DOCUMENTS

| | | | |
|---|---|---|---|
| 5,470,788 A | 11/1995 | Biery et al. | |
| 6,202,191 B1 | 3/2001 | Filippi et al. | |
| 6,320,262 B1 | 11/2001 | Murakami | |
| 6,383,920 B1 | 5/2002 | Wang et al. | |
| 6,992,390 B2 | 1/2006 | Edelstein et al. | |
| 7,062,850 B2 | 6/2006 | Atakov et al. | |
| 7,564,135 B2 * | 7/2009 | Park | 257/758 |
| 7,986,040 B2 | 7/2011 | Bartsch et al. | |
| 2006/0024953 A1 | 2/2006 | Papa Rao et al. | |
| 2006/0163735 A1 * | 7/2006 | Tseng | 257/758 |

FOREIGN PATENT DOCUMENTS

| | | |
|---|---|---|
| CN | 1913128 | 2/2007 |
| CN | 1000034 | 1/2012 |

* cited by examiner

*Primary Examiner* — Ha Tran T Nguyen
*Assistant Examiner* — Thanh Y Tran
(74) *Attorney, Agent, or Firm* — Yuanmin Cai

(57) ABSTRACT

An embodiment of the invention provides a semiconductor structure, which may include a stud of a first conductive material formed inside a dielectric layer; a via of a second conductive material having a bottom and sidewalls with the bottom and the sidewalls being covered by a conductive liner, and the bottom being formed directly on top of the stud and being in contact with the via through the conductive liner; and one or more conductive paths of a third conductive material connecting to the via through the conductive liner at the sidewalls of said the. A method of making the semiconductor structure is also provided.

19 Claims, 14 Drawing Sheets

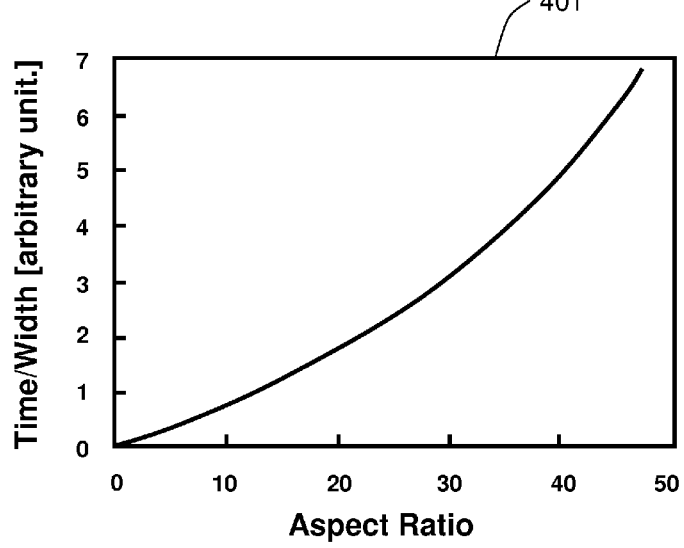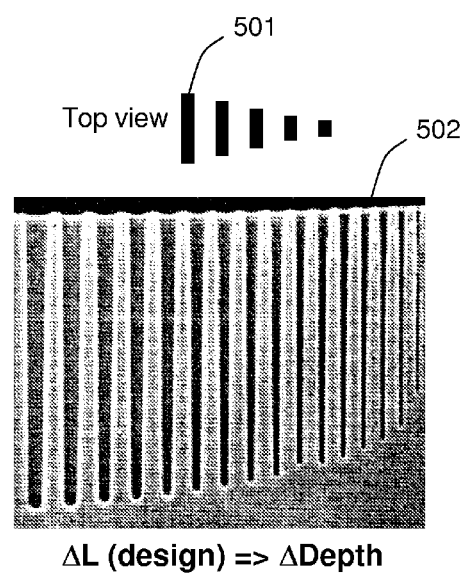
FIG. 14A
FIG. 14B

US 8,349,723 B2

STRUCTURE OF POWER GRID FOR SEMICONDUCTOR DEVICES AND METHOD OF MAKING THE SAME

CROSS REFERENCE TO RELATED APPLICATION

This application is a divisional application of U.S. patent application Ser. No. 12/491,372, filed Jun. 25, 2009, the content of which is incorporated herein by reference in its entirety.

FIELD OF THE INVENTION

The present invention relates generally to the field of semiconductor device manufacturing and in particular relates to structure of power grid that provides electric power to semiconductor devices and method of making the same.

BACKGROUND OF THE INVENTION

As performance of semiconductor devices such as transistors, for example silicon-germanium (SiGe) heterojunction bipolar transistors (HBTs) and/or various types of field-effect-transistors (FETs), continues to improve, demand for electric power or current supply by various types of semiconductor devices continues to increase. In general, electric current used by these semiconductor devices manufactured on a semiconductor chip are supplied through a set of electric interconnects which may act like a "power grid" of the semiconductor chip and therefore be referred to hereinafter like that. The power grid distributes electric power to various active semiconductor devices on the chip and is usually manufactured through processes commonly known as back end of the line (BEOL) technology. A power grid may spread across different conductive levels, including M1 level, M2 level, etc., and may in general provide electric power or current to the various semiconductor devices using conductive wires, paths, and/or pathways at different levels, and using vias and/or studs in crossing different levels, as is commonly known in the art.

FIG. 1A and FIG. 1B are demonstrative illustrations of a power grid structure, as is known in the art, that provides electric power to a semiconductor device. For example, semiconductor structure 100 may represent a portion or fraction of a large scale power grid that supplies electric power to one or more semiconductor devices manufactured on a single substrate. For example, semiconductor structure 100 may include a conductive stud 112 such as, for example, a CA contact stud that is formed on top of and in contact with a semiconductor device 102 that may be formed on a semiconductor substrate 101. Semiconductor structure 100 may also include a conductive wire, path, or pathway 122 such as, for example, an M1 level contact on top of and in contact with conductive stud 112, as being illustrated in FIG. 1A. Conductive stud 112 may be formed inside and/or through a dielectric layer 111, which may be for example an inter-level dielectric (ILD) layer. As is known in the art, generally a conductive liner 121 may be formed between M1 level contact of conductive path 122 and ILD layer 111, as well as at the sidewalls of M1 level, to reduce and/or eliminate potential metal contamination which may be caused by diffusion of metal element of conductive path 122 into ILD layer 111, and to increase and/or enhance adhesiveness of conductive path 122 to ILD layer 111. Further, a dielectric capping layer 131, for example a silicon nitride layer, may be formed on top of conductive path 122, upon which other ILD layer or layers (not shown) may be deposited to form additional metal level contacts. Similar to conductive liner 121, dielectric capping layer 131 may also serve the function of reducing metal contamination and/or improving isolation of conductive path 122.

FIG. 1B demonstratively illustrates that during normal operation of semiconductor device 102, electrons may flow from conductive stud 112 towards conductive path 122. Conductive stud 112 and conductive path 122 may be made of materials of different conductivity. In addition, current density at conductive stud 112 and conductive path 122 may be different due to different current levels and/or different cross-sectional areas thereof. Consequently, at a joint or intersection area 120 of conductive stud 112 and conductive path 122, electro-migration may occur and may manifest itself as causing or creating voids between conductive stud 112 and conductive path 122. The void created by electro-migration may gradually increase in size with the time of usage of semiconductor device 102, and may ultimately cause an open circuit at joint area 120 between conductive stud 112 and conductive path 122. In other words, electro-migration may create reliability concerns for semiconductor device 102 that employs a conventional power grid, like structure 100, for electric power supply. Such reliability concerns become particularly important when conductive path 122 is a M1 level contact.

SUMMARY OF EMBODIMENTS OF THE INVENTION

There is a need in the art to create semiconductor structures or improve existing semiconductor structures that can be used reliably as power grid for supplying electric power or current to various semiconductor devices. The semiconductor structures will be able to overcome the above concerns caused by electro-migration and improve overall performance and reliability of the semiconductor devices to which electric power is supplied.

An embodiment of the invention provides a semiconductor structure. The semiconductor structure may include a stud of a first conductive material formed inside a dielectric layer; a via of a second conductive material having a bottom and sidewalls, wherein the bottom and the sidewalls being covered by a conductive liner and the bottom being formed directly on top of the stud and being in contact with the via through the conductive liner; and one or more conductive paths of a third conductive material connecting to the via through the conductive liner at the sidewalls of the via.

In an embodiment of the invention, conductivity of the second conductive material of the via may be greater than conductivity of the conductive liner covering the via at the bottom and the sidewalls.

In another embodiment of the invention, a lateral dimension of the via measured by two of the sidewalls opposing each other may be less than a Blech length, wherein the Blech length may be associated with electro-migration of metal atoms inside the via and may be affected at least partially by properties of the second conductive material of the via.

In yet another embodiment of the invention, the second conductive material may be copper (Cu) and may be different from the third conductive material of the conductive paths, wherein the Blech length of the copper material may be approximately around 10 micrometers.

In yet another embodiment of the invention, the first and the second conductive materials may be selected from a group consisting of tungsten (W), aluminum (Al), copper (Cu), and alloy thereof, and the third conductive material may be selected from a group consisting of aluminum (Al), copper (Cu), silver (Ag), and gold (Au).

In yet another embodiment of the invention, conductive liner may be made of a material being selected from a group consisting of titanium (Ti), tantalum (Ta), ruthenium (Ru), tungsten (W), titanium-nitride (TiN), tantalum-nitride (TaN), ruthenium nitride (RuN), and tungsten nitride (WN), and the conductive liner is capable of preventing conductive materials from diffusing therethrough.

In yet another embodiment of the invention, the stud may be formed directly on top of a contact location of a semiconductor device formed in a substrate underneath the dielectric layer. As an example, the semiconductor device may be a field-effect transistor (FET), and the contact location may be a gate region, a source region, or a drain region of the FET. As another example, the semiconductor device may be a heterojunction bipolar transistor (HBT), and the contact location may be a base region, a emitter region, or a collector region of the HBT.

BRIEF DESCRIPTION OF THE DRAWINGS

The present invention will be understood and appreciated more fully from the following detailed description of the invention, taken in conjunction with the accompanying drawings of which:

FIGS. 14A and 14B are sample experimental test results illustrating etching ratios for different via sizes.

Figure 1A:
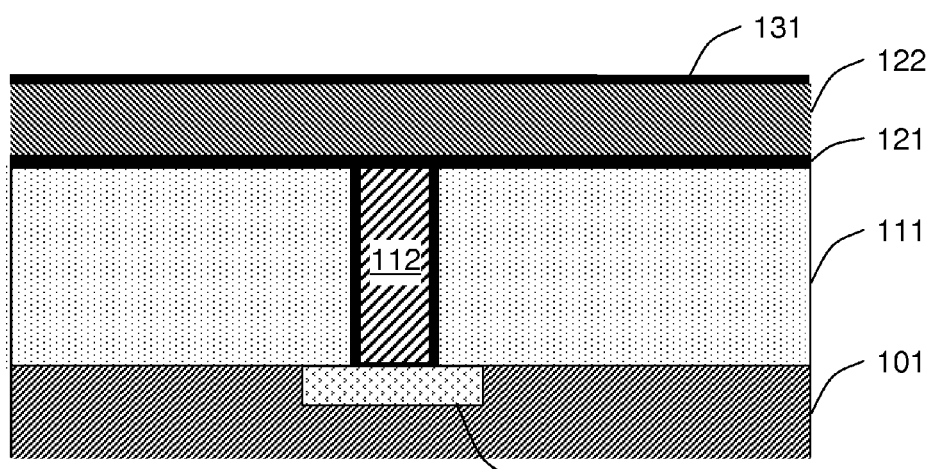
FIGS. 1A and 1B are demonstrative illustrations of a prior art structure that provides electric power to a semiconductor device.
Figure 1B:
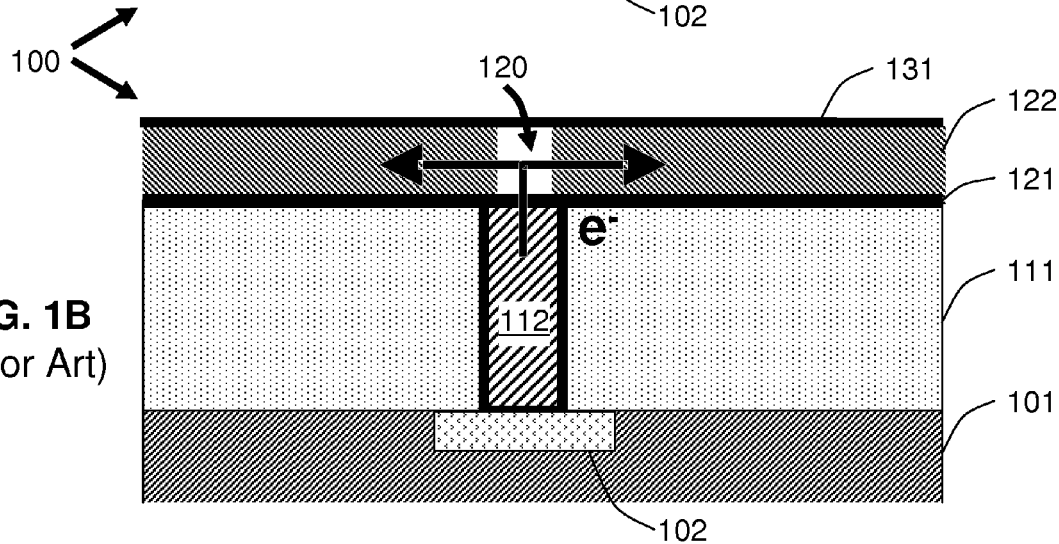

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

Figure 2:
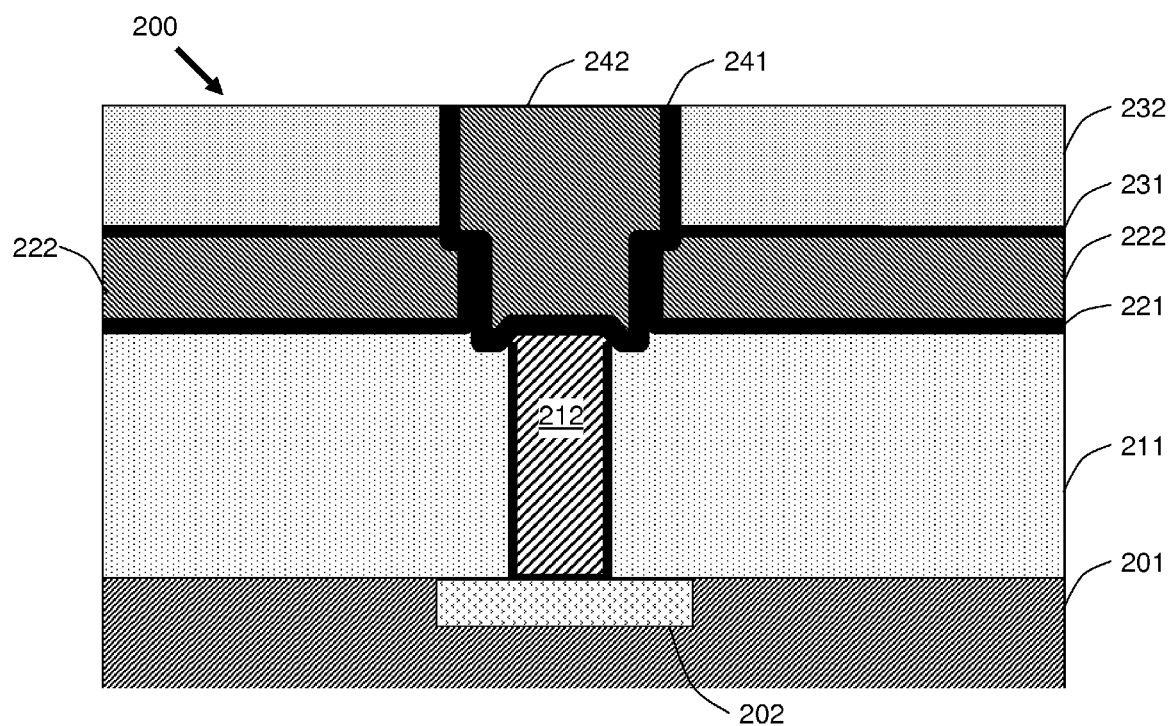
FIG. 2 is a demonstrative illustration of a power grid structure according to an embodiment of the invention.

FIG. 2 is a demonstrative illustration of a power grid structure according to an embodiment of the invention. For example, power grid structure 200, or structure 200, may include a conductive stud 212 such as a CA contact formed or created within a dielectric layer 211. Conductive stud 212 may be formed on top of and in contact with a semiconductor device 202 and may be made suitable for passing or conveying electric power or electric current to semiconductor device 202. Semiconductor device 202 may be formed in a semiconductor substrate 201, which is covered by dielectric layer 211 as being illustrated in FIG. 2.

Structure 200 may also include a conductive via 242 formed at least partially within a dielectric layer 232 and directly on top of and in contact with conductive stud 212. Conductive via 242 may include a conductive liner 241 covering bottom and sidewalls thereof. Structure 200 may additionally include one or more conductive paths 222, which may be for example M1 level contacts or wires, in contact with conductive via 242 through conductive liner 241. Conductive paths 222 may be formed on top of dielectric layer 211 through a conductive liner 221 and may be covered by a dielectric capping layer 231, upon which dielectric layer 232 may be formed.

Figure 13:
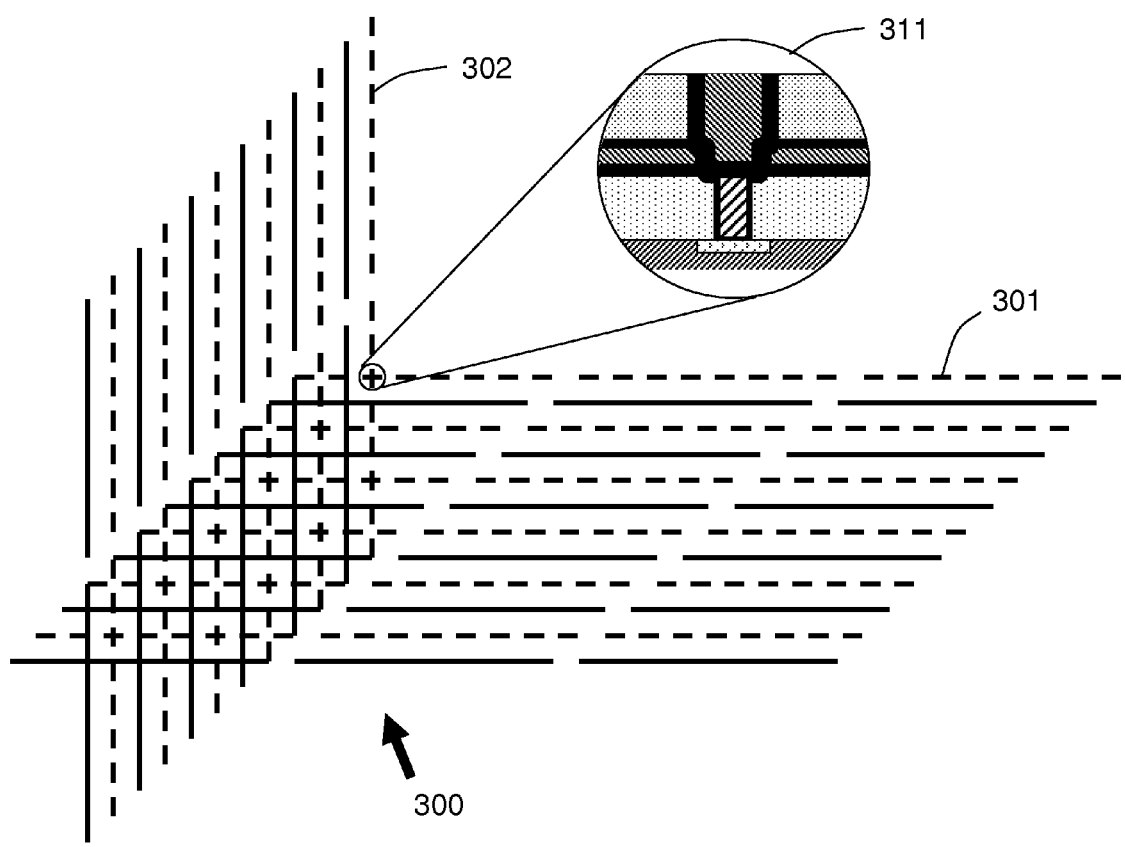
FIG. 13 is a demonstrative illustration of a top view of a large scale power grid according to another embodiment of the invention.

Here, it is to be understood that structure 200 may be a part of or a fraction of a large power grid 300 as being illustrated in FIG. 13, which may include multiple semiconductor structures that, in an embodiment, may be similar to structure 200 and may be interconnected properly as needed for supplying electric power to one or more semiconductor devices situated on a common substrate. In other words, structure 200 may function and be considered as a "node" or "island", as may be referred to hereinafter from time to time, of a big power grid 300 illustrated in FIG. 13.

According to another embodiment of the invention, conductive via 242 may be formed to have a lateral dimension smaller than a Blech length of electro-migration of conductive via 242. Here, it is to be understood that the lateral dimension of conductive via 242 is measured in a generally same lateral level as that of conductive paths 222, and between two opposing sidewalls of conductive via 242. A Blech length, or $L_{Blech}$, of a conductive material is generally determined by the equation of $L_{Blech}=(jL)_{th}/j$, wherein $(jL)_{th}$ is the Blech threshold of the conductive material as is known in the art, and j is a current density passing through the conductive material in a direction where the Blech length is measured. For example, the Blech threshold $(jL)_{th}$ of conductive via 242 is generally affected by the conductivity of material making conductive via 242, and for a conductive via made of copper material, for example, the Blech threshold $(jL)_{th}$ is typically around 200 milliamp per micrometer (mA/μm). The current density may generally be measured, for example, in a unit of milliamp per micrometer square (mA/μm²). Therefore, for a current density of for example 20 mA/μm² passing laterally through conductive via 242, the Blech length may typically be found around 10 micrometers (μm).

Material of conductive via 242 may be made different from material of conductive stud 212 and may also be made different from material of conductive paths 222. Consequently, conductivity of conductive via 242, conductive stud 212, and conductive paths 222 may be different. For example, in an embodiment of the invention, conductivity of conductive via 242 may be greater than that of conductive stud 212. In another embodiment, conductivity of conductive via 242 may be made same as that of conductive paths 222.

Figure 3:
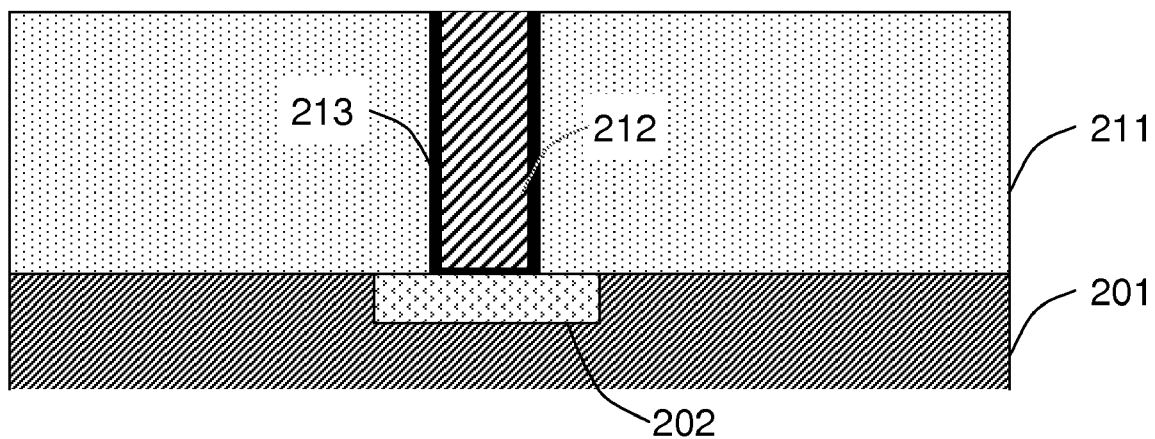
FIG. 3 is a demonstrative illustration of a method of forming a power grid structure according to an embodiment of the invention.

FIG. 3 is a demonstrative illustration of a method of forming a power grid structure according to an embodiment of the invention. The power grid may include one or more structures that are similar to power grid structure 200 illustrated in FIG. 2. For example, as being illustrated in FIG. 3, an embodiment of the invention may include providing a semiconductor substrate 201, upon which one or more semiconductor devices such as, for example, semiconductor device 202 and various other devices (not shown) may have been formed and upon which a power grid is to be formed to provide electric current for the various devices. An embodiment of the invention may include depositing an inter-level dielectric layer (ILD) 211 on top of substrate 201 and subsequently create a conductive stud 212 such as a CA contact inside or within ILD layer 211. Conductive stud 212 may be formed to include a conductive metal liner 213 at sidewalls between conductive stud 212 and ILD layer 211. Conductive liner 213 may be formed to prevent potential metal contamination of ILD layer 211 by metal element of conductive stud 212, among others, and to increase adhesiveness of conductive stud 212 to ILD layer 211. Conductive stud 212 may be created or formed by applying any suitable existing BEOL processes and/or any future developed techniques, and may be made of materials such as tungsten (W), aluminum (Al), copper (Cu), or alloy thereof. Conductive liner 213 may be made of materials such as titanium (Ti), tantalum (Ta), titanium-nitride (TiN), tantalum-nitride (TaN), and a combination or alloy thereof. Conductive stud 212 may be made on top of and in contact with a contact location of semiconductor device 202, to which electric power may be supplied or provided.

Figure 4:
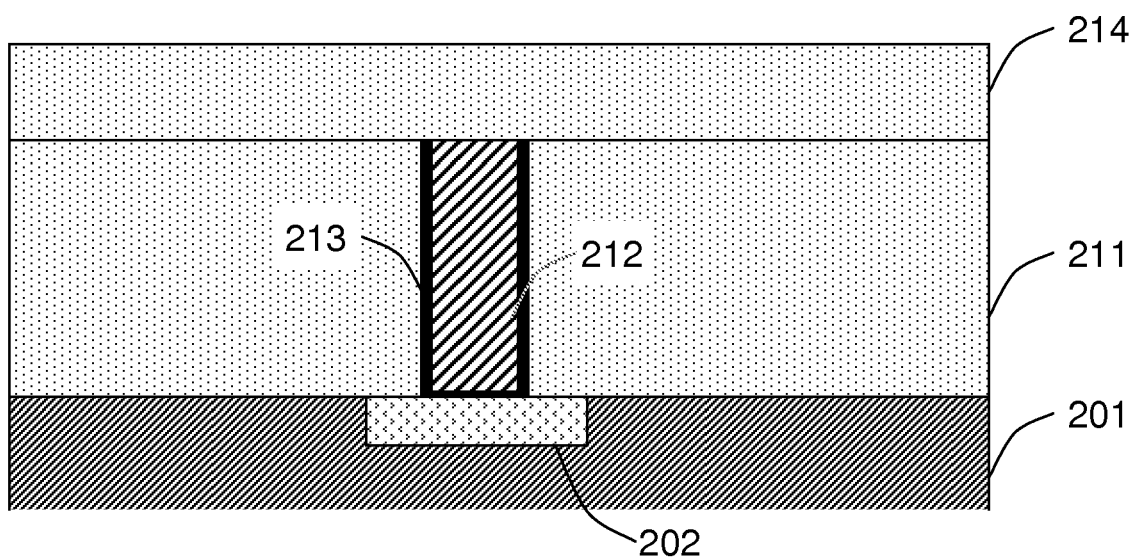
FIG. 4 is a demonstrative illustration of a method of forming a power grid structure according to another embodiment of the invention.

FIG. 4 is a demonstrative illustration of a method of forming a power grid structure according to another embodiment of the invention. For example, following the formation of conductive stud 212, an embodiment of the invention may include forming or depositing another ILD layer 214 on top of ILD layer 211 wherein conductive paths or pathways may be formed as being described below in more details with reference to FIG. 5. ILD layer 214 may be formed on top of to cover both ILD layer 211 and conductive stud 212; may be a same dielectric material as that of ILD layer 211; and may have preferably a thickness close to that of the contact level wiring structure to be formed wherein, although embodiments of the invention are not limited in these respects. It is to be understood that different dielectric materials and/or different thickness may be used in forming ILD layer 214.

Figure 5:
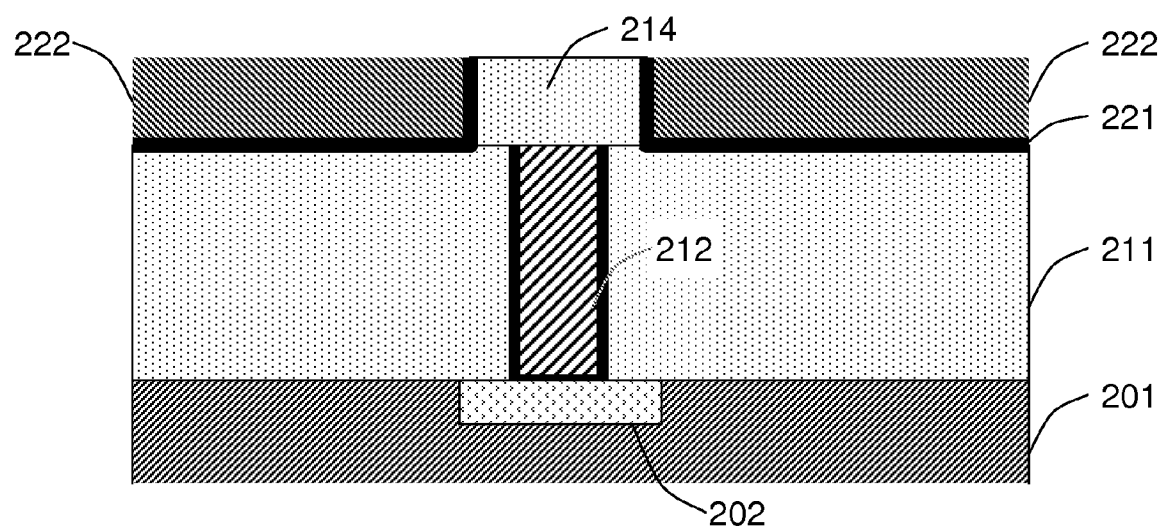
FIG. 5 is a demonstrative illustration of a method of forming a power grid structure according to yet another embodiment of the invention.

FIG. 5 is a demonstrative illustration of a method of forming a power grid structure according to yet another embodiment of the invention. For example, an embodiment of the invention may include creating one or more conductive paths 222 within ILD layer 214. Conductive paths 222 may be M1 level contact or M1 level wiring structure for eventually passing electric power or electric current to semiconductor device 202 via conductive stud 212. Conductive paths 222 may be made inside ILD layer 214, preferably next to and preferably not in contact with conductive stud 212.

According to an embodiment of the invention, a portion of ILD layer 214 may be left on top of conductive stud 212. A lateral size of the portion of ILD layer 214 may be determined by the type and property of conductive material, for example conductivity, to be used in forming conductive via 242 shown in FIG. 2 where the portion of ILD layer 214 is situated, as being described below in more details. However, it is to be understood that embodiments of the invention are not limited in this respect. For example, another embodiment of the invention may include forming conductive paths 222 in contact with and/or covering conductive stud 212 with the conductive path portion on top of conductive stud 212 being removed and/or replaced by a conductive via later.

An embodiment of the invention may include forming or creating conductive paths 222 by applying any suitable existing BEOL processes and/or future develop techniques, and may include depositing a conductive metal liner 221 on top of ILD layer 211 before forming conductive paths 222. Materials suitable for conductive paths 222 may be the same as or different from materials used for conductive stud 212. For example, conductive paths 222 may be made of materials having conductivity greater than that of conductive stud 212. Further for example, the materials may include copper (Cu), aluminum (Al), silver (Ag), gold (Au), or alloy thereof. Materials used for conductive liner 221 may include, for example, titanium, tantalum, ruthenium, tungsten, titanium-nitride, tantalum-nitride, ruthenium-nitride, and/or tungsten-nitride, etc.

At this point, a comparison may be made between conductive paths 222 and conventional conductive path 122 as being illustrated in FIG. 1A. It is to be appreciated that an embodiment of the invention forms conductive paths 222 without removing the portion of dielectric material 214 which is directly on top of conductive stud 212, wherein conductive via 242 covered by conductive liner 241, as shown in FIG. 2, is to be formed according to an embodiment of the invention and being described below in more details with reference to FIGS. 6-9.

Figure 6:
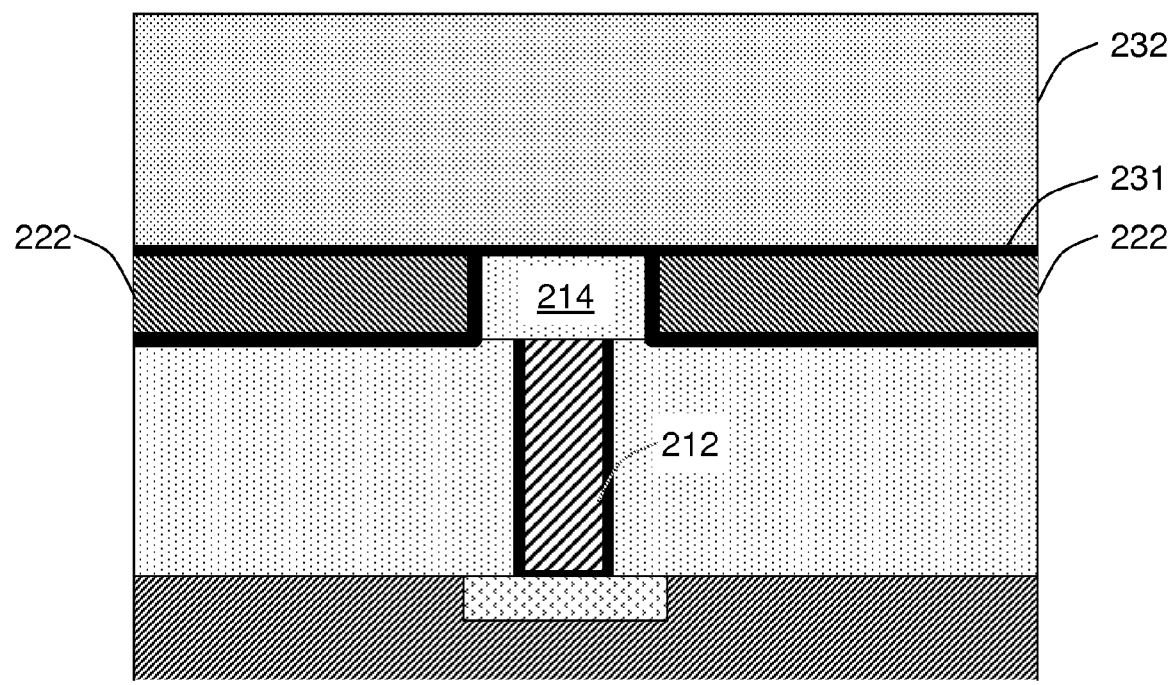
FIG. 6 is a demonstrative illustration of a method of forming a power grid structure according to yet another embodiment of the invention.

FIG. 6 is a demonstrative illustration of a method of forming a power grid structure according to yet another embodiment of the invention. For example, an embodiment of the invention may include depositing a dielectric capping layer 231 on top of conductive paths 222 and ILD layer 214, and then depositing another ILD layer 232 on top of dielectric capping layer 231. The use of dielectric capping layer 231 may help prevent contamination of materials of conductive paths 222 into ILD layer 232 and improve overall isolation of conductive path 222.

Figure 7:
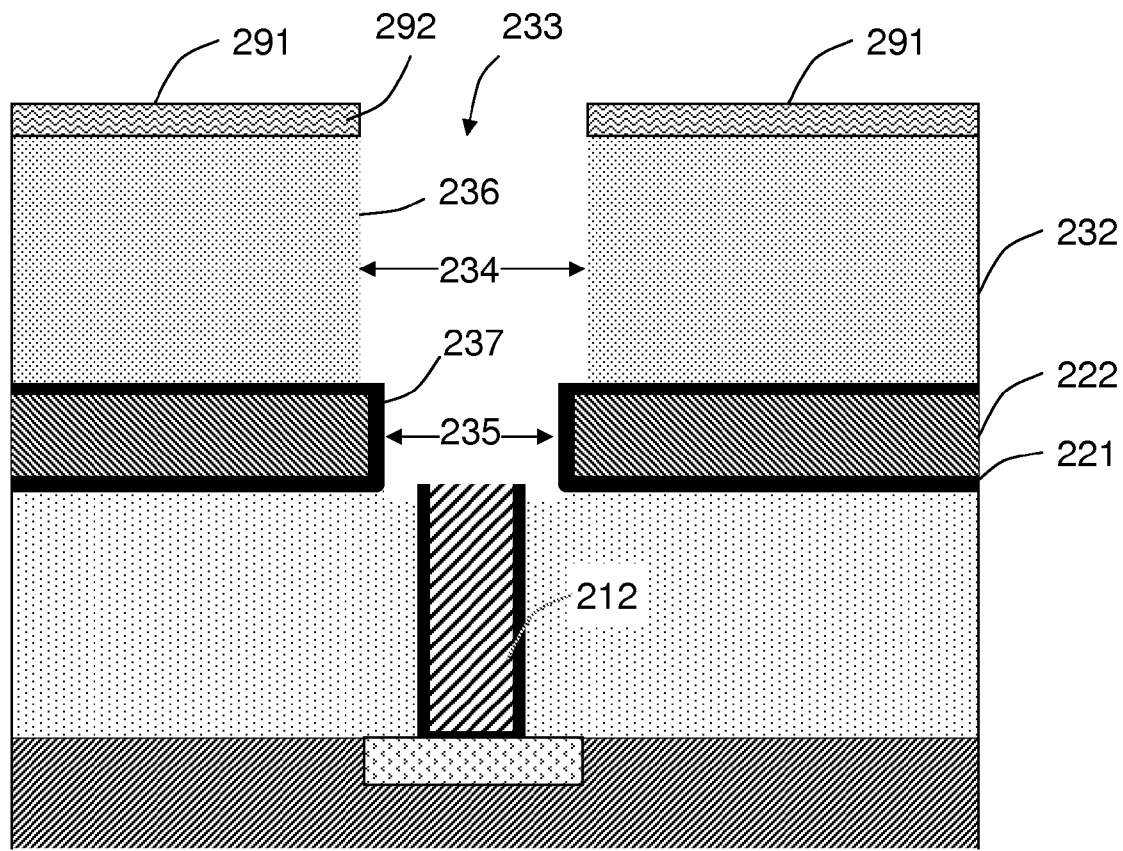
FIG. 7 is a demonstrative illustration of a method of forming a power grid structure according to yet another embodiment of the invention.

FIG. 7 is a demonstrative illustration of a method of forming a power grid structure according to yet another embodiment of the invention. After the formation of ILD layer 232, an embodiment of the invention may include creating a via hole 233 inside ILD layer 232 and in where the remaining portion of ILD layer 214, as shown in FIG. 6, exists between conductive paths 222 and on top of conductive stud 212. Via hole 233 may be formed through any suitable BEOL processes which may include for example applying a resist layer 291 on top of ILD layer 232, patterning resist layer 291 through for example a lithographic process, and forming a via pattern 292 that aligns with conductive stud 212 underneath and has a size that is at least as large as that of remaining ILD layer 214 (FIG. 6) between conductive paths 222. The embodiment of the invention may also include etching ILD layer 232, and ILD layer 214 underneath, through via pattern 292 to form or create via hole 233 having sidewalls 236 and 237 ILD layer 214 between conductive paths 222 may be removed to expose sidewalls of conductive paths 222 and top surface of conductive stud 212. Sidewalls 237 of conductive paths 222, in the area above stud 212, may be covered by conductive liner 221.

As being illustrated in FIG. 7, via hole 233 may be subdivided into two distinct sections. The upper section, mainly formed inside ILD layer 232, may have a width 234 that is at least as large as, and in most cases larger than, a width 235 of the lower section which is mainly formed where the remaining portion of ILD layer 214 (FIG. 6) existed previously. When creating or forming via hole 233, width 234 of upper section may be determined by the size of via pattern 292, as described above, and width 235 of the lower section may be determined by the size of ILD layer 214 (FIG. 6) remaining between conductive paths 222, most of which remaining on top of conductive stud 212. Another embodiment of the invention may include making via pattern 292 larger than the size of ILD layer 214 between conductive paths 222, thereby ensuring that the remaining dielectric materials between conductive pathways 222 are at least substantially removed or etched away to expose metal liner 221. The etching process may be selective and therefore may not etch conductive metal liner 221 thus leaving the size of the lower section of via hole 233 being determined and/or limited by the distance between the two conductive paths 222. Yet, another embodiment of the invention may include making via hole 233 deep enough to expose the top surface of conductive stud 212.

Figure 8:
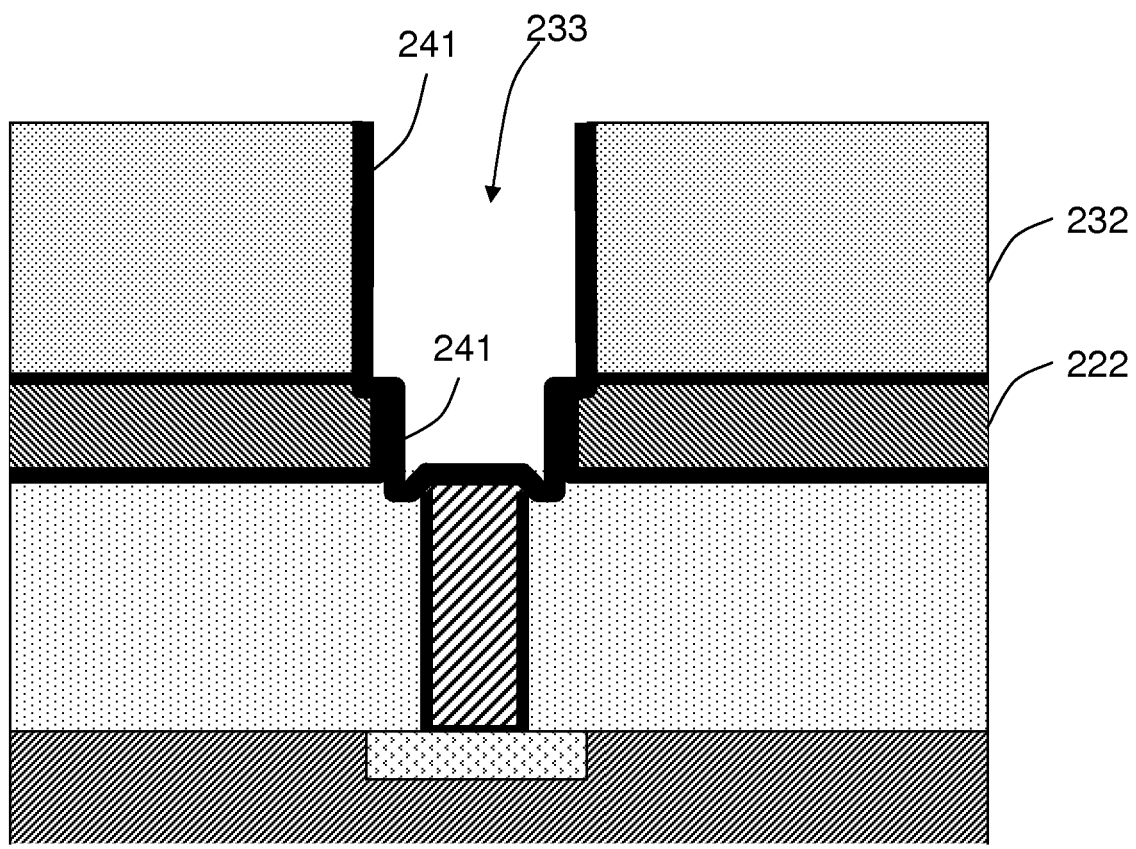
FIG. 8 is a demonstrative illustration of a method of forming a power grid structure according to yet another embodiment of the invention.

FIG. 8 is a demonstrative illustration of a method of forming a power grid structure according to yet another embodiment of the invention. For example, an embodiment of the invention may include depositing a conductive liner 241, for example a metal liner, over the inner sidewalls and bottom of via hole 233 inside ILD layer 232 and between conductive paths 222. Material of conductive liner 241 may preferably have a lower conductivity comparing with that of conductive paths 222, although embodiments of the present invention may not be limited in this respect. For example, material of conductive liner 241 may include, for example, titanium, tantalum, ruthenium, tungsten, titanium-nitride, tantalum-nitride, ruthenium-nitride, and/or tungsten-nitride, although other suitable materials may also be contemplated. Conductive liner 241 may also be formed by any other conductive material that may serve as a barrier and is capable of preventing conductive materials from diffusing there through.

Figure 9:
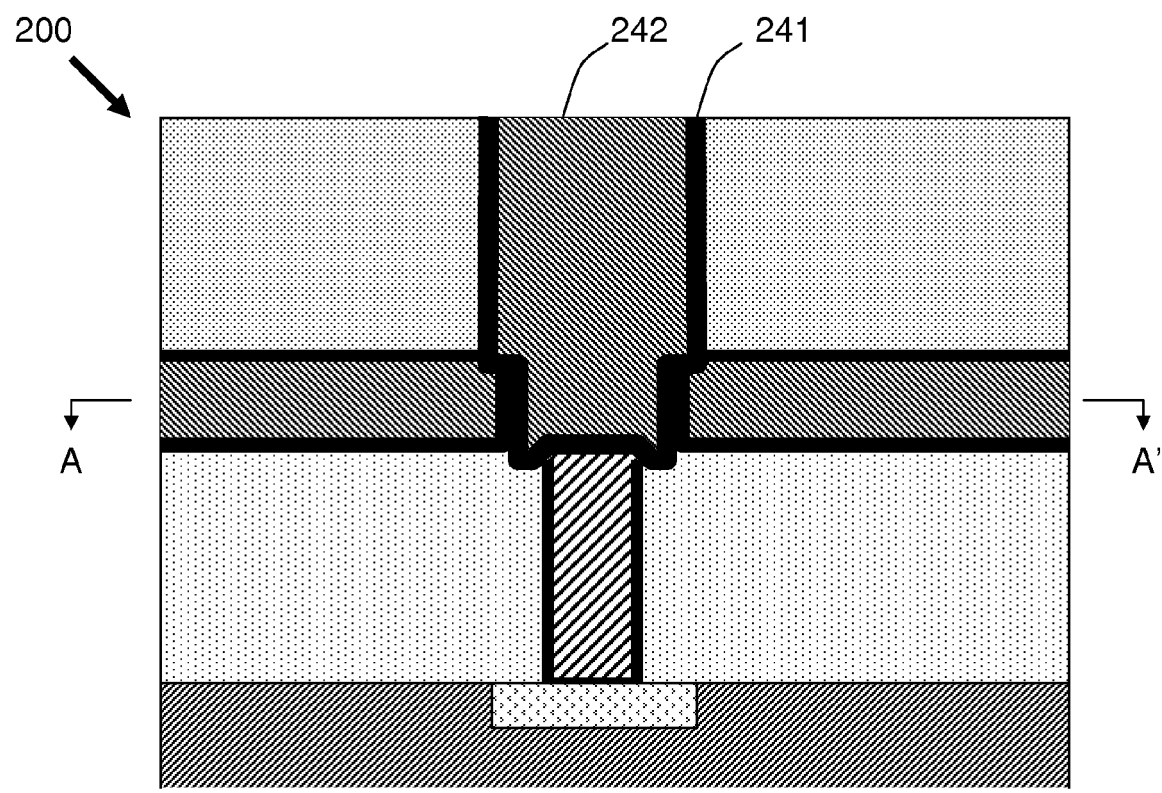
FIG. 9 is a demonstrative illustration of a method of forming a power grid structure according to yet another embodiment of the invention.

FIG. 9 is a demonstrative illustration of a method of forming a power grid structure according to yet another embodiment of the invention. For example, an embodiment of the invention may include depositing a conductive material into via hole 233 of FIG. 8 to form conductive via 242 that has sidewalls and bottom being covered by conductive liner 241, thereby forming power grid structure 200 which may be a same power grid structure of 200 shown in FIG. 2. The conductive material filling via hole 233 of FIG. 8 may include, for example, tungsten (W), aluminum (Al), copper (Cu), and alloy thereof. A cross-sectional view at A-A' of power grid structure 200 may be illustrated in FIG. 10.

Figure 10:
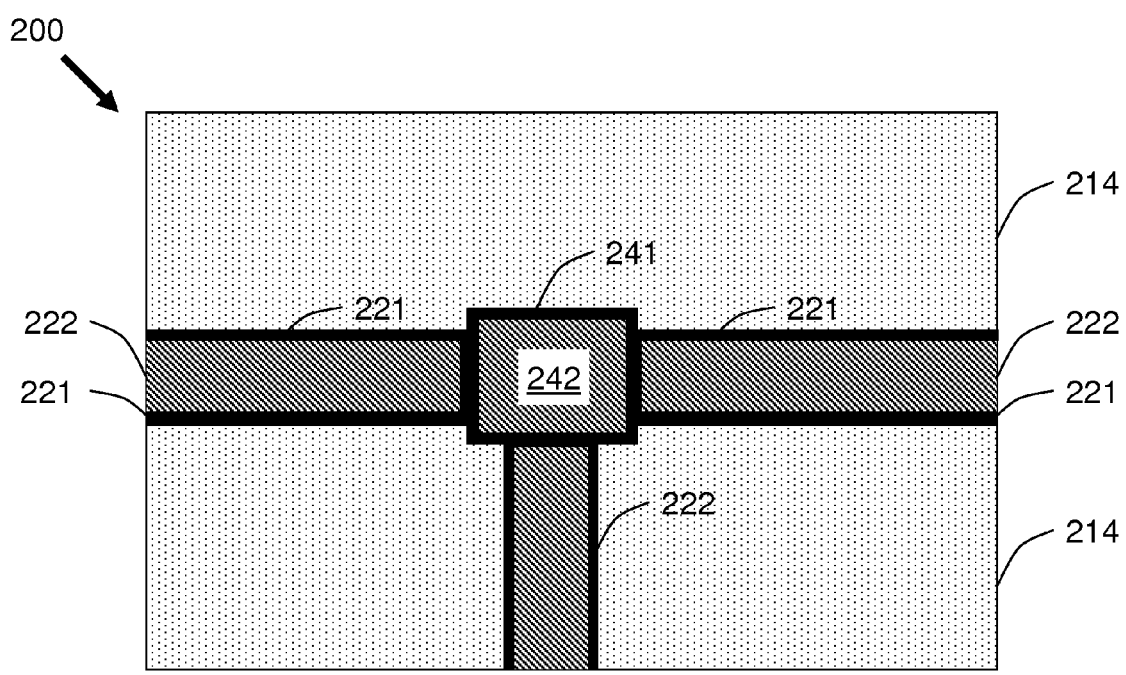
FIG. 10 is a demonstrative illustration of a method of forming a power grid structure according to yet another embodiment of the invention.

FIG. 10 is a demonstrative illustration of a method of forming a power grid structure according to yet another embodiment of the invention. In fact, power grid structure 200 may be a cross-sectional view of power grid structure 200 indicated by A-A' as being illustrated in FIG. 9. For example, one or more conductive paths 222 may be formed inside dielectric layer 214, and in contact with via 242 at the conductive liner 241. Conductive liner 241 may cover sidewalls of via 242, while conductive liner 221 may be formed between conductive paths 222 and dielectric layer 214.

Figure 11:
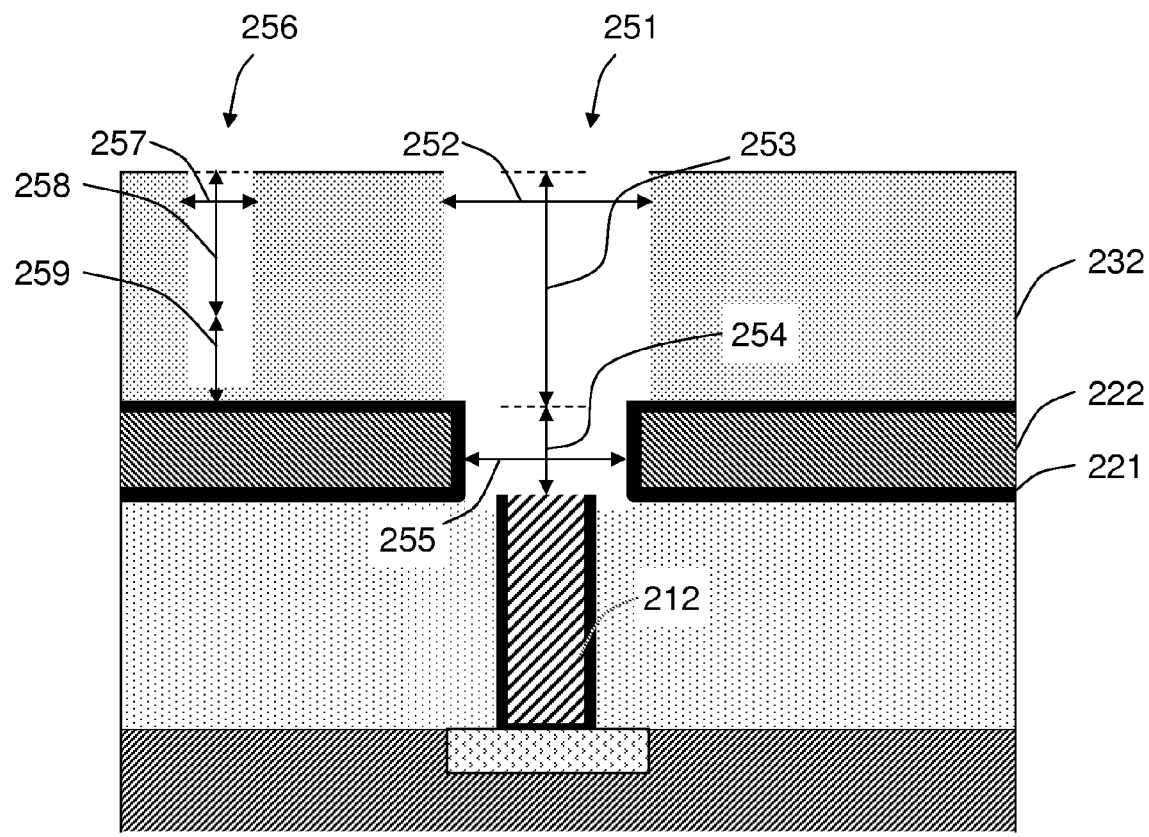
FIG. 11 is a demonstrative illustration of a method of forming a power grid structure according to another embodiment of the invention.

FIG. 11 is a demonstrative illustration of a method of forming a power grid structure according to another embodiment of the invention. For example, FIG. 11 illustrates a method of forming or creating a via hole 251, which may be a same via hole as, or a different via hole from, via hole 233 in FIG. 8. In this embodiment of the invention, the etching process and in particular an etching rate of creating via hole 251 (which exposes conductive stud 212 underneath) may be adjusted and/or designed to work with processes of creating other via holes in other areas of ILD layer 232 where the other via holes may stop at conductive paths 222. In other words, the other via holes created in other areas of ILD layer 232, for example a via hole 256, may have a combined depth of 258 and 259 that is different from a combined depth of 253 and 254. Therefore the creation of via hole 251 may not require any separate and/or additional etching process.

Reference is briefly made to FIGS. 14A and 14B, which illustrate etching ratios for different via sizes. As being illustrated in FIG. 14A, during the etching of via holes in a dielectric material, it is well known to those of ordinary skill in the art that the rate of etching in the depth direction is generally affected by the lateral dimension of the via holes. For example, in FIG. 14A, x-coordinate denotes the aspect ratio of a via hole under etching and y-coordinate, in arbitrary unit, denotes the time of etching after normalized by the width of the via hole. FIG. 14A demonstrates that with the aspect ratio of the via hole increasing, that is, with the lateral dimension of the via hole becoming smaller, the time required for etching the via hole also increases. In another embodiment of the invention, the increase in time of etching is found to be almost at a second polynomial order of the aspect ratio.

This relationship between etching rate and the ratio of depth over lateral dimension of the via hole may also be observed in FIG. 14B, which demonstratively illustrates a top view of a set of via holes 501 of different lateral sizes, shown in a vertical direction in the top view of FIG. 14B, as well as a SEM picture 502 that shows different depths etched of the set of via holes 501 during a same etching process. It is concluded from the experimental results shown in FIG. 14B that via holes of different dimensions in one direction, even though having the same dimension in the other direction, may be etched at different rate during a same etching process. For example, a same etching process may produce different etching depths for the via holes with the via hole having a bigger size being etched deeper into the dielectric material.

Reference is now made back to FIG. 11, wherein it is illustrated that via hole 256 may be created during the same etching process as that in creating via hole 251. For example, according to an embodiment, the invention may include selecting and/or designing a relative relationship between lateral sizes 252 and 257 of via hole 256 and via hole 251 respectively, according to the difference in etching ratio for via holes of different lateral sizes as being illustrated in FIGS. 14A and 14B. In another embodiment, only a fraction 258 of ILD layer 232 may be etched for via hole 256 when via hole 251 is etched through the entire thickness 253 of ILD layer 232, and the remaining fraction 259 of ILD layer 232 may be etched for via hole 256 during the etching of ILD layer 214 (of FIG. 6) of a thickness 254 for via hole 251. In another embodiment of the invention, the lateral dimension 255 of via hole 251 may also be taken into account in selecting the etching rate of via hole 251, and how it may affect the etching of via hole 256.

It is to be understood that embodiments of the invention may not be limited in the above respects. For example, the etching of via holes 251 and 256 may not be necessarily performed at the same time or may not be necessarily etched to the bottom at the same time or at substantially the same time. In fact, for example, the bottom of via hole 256 and/or via hole 251 may be covered by metal liner 221 which in general does not subject to etching because of the selectivity of etching process. In other words, the etching conditions may be primarily designed for the etching of dielectric material, and metal liner 221 may function as an etch-stop layer during the via etching process. Therefore, according to another embodiment of the invention, via holes 251 and 256 may be etched at independent rates even though the etching may not reach the bottom of via holes at the same time.

Figure 12:
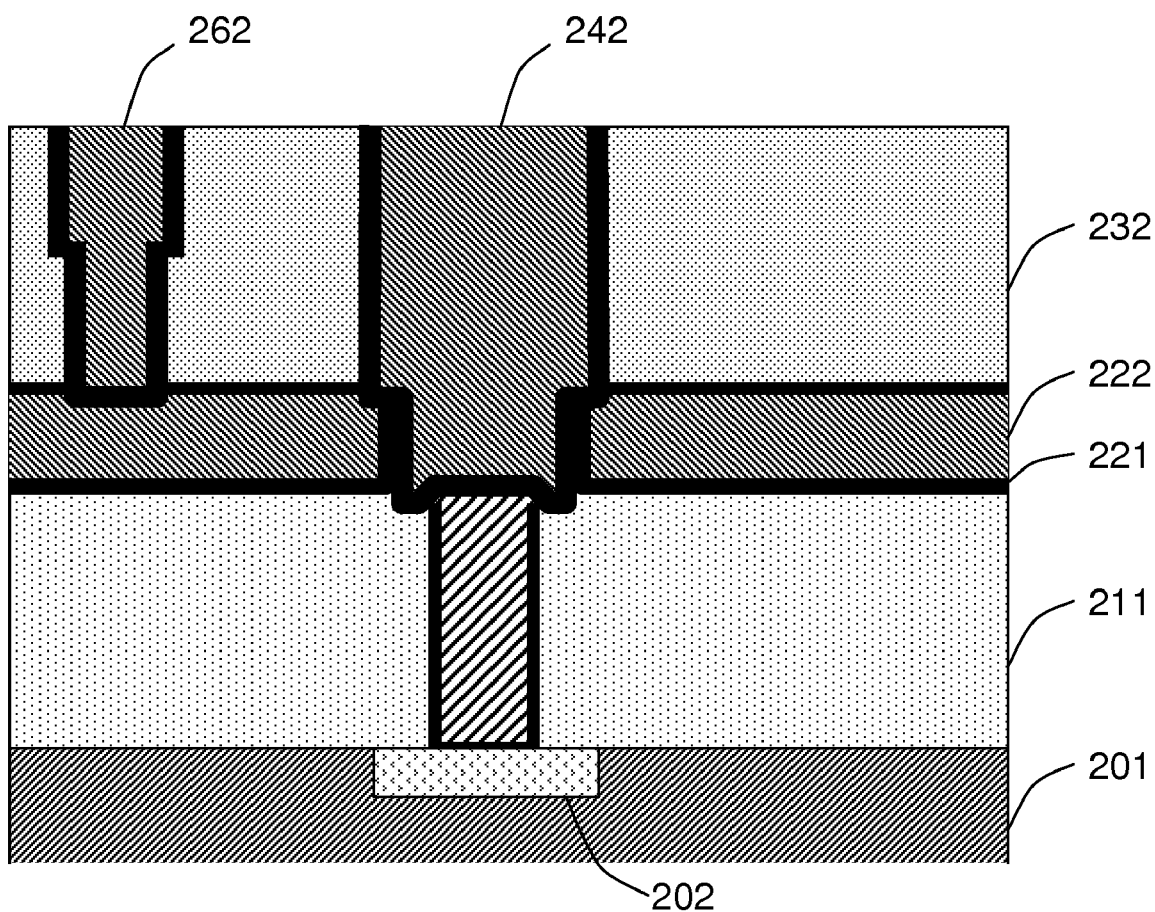
FIG. 12 is a demonstrative illustration of a method of forming a power grid structure according to yet another embodiment of the invention.

FIG. 12 is a demonstrative illustration of a method of forming a power grid structure according to yet another embodiment of the invention. Following the formation of via holes 251 and 256 (of FIG. 11), via holes 251 and 256 may be filled with conductive materials to form via 242 and via 262. The formation of via 242 and 262 may be through, for example, the deposition of conductive materials by a suitable currently available BEOL process or any future developed technique. Any excess conductive materials that may be left on top of ILD layer 232 may be removed by applying a chemical-mechanical polishing (CMP) process known in the art.

FIG. 13 is a demonstrative illustration of a top view of a large scale power grid according to another embodiment of the invention. For example, power grid 300 may include, for example, a first group of multiple conductive paths 301 and a second group of multiple conductive paths 302. The first group of conductive paths 301 may cross over, preferably perpendicularly, one or more of the second group of conductive paths 302. However, embodiments of the invention may not be limited in this respect and the two groups of conductive paths may cross each other, at one or more points, at angles other than a normal angle. Moreover, at least one of the crossover points, for example crossover point 311, may be a "node" or "island" of power grid 300 and may have a structure as being illustrated in FIG. 2 and described above in detail. Here, it is to be understood that a "node" or "island" of power grid structure, such as power grid structure 200 shown in FIG. 2, may not be limited to only crossover points. For example, power grid structure like the one illustrated in FIG. 2 may be used at any point along any of the conductive paths 301 and/or 302, and furthermore may be used at different contact levels of a semiconductor chip structure.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    forming a conductive stud inside a first dielectric layer;
    forming one or more conductive paths inside a second dielectric layer, said second dielectric layer being on top of said first dielectric layer, wherein said one or more conductive paths being substantially close to a region of said second dielectric layer remaining on top of a top surface of said conductive stud;
    forming a via hole on top of and exposing said top surface of said conductive stud, said via hole exposing at least a portion of sidewalls of said one or more conductive paths;
    depositing a conductive liner at a bottom and sidewalls of said via hole; and
    depositing a conductive material in said via hole forming a via, said via being in contact with said one or more conductive paths via said conductive liner,
    wherein forming said conductive stud comprises forming said conductive stud on top of and being in contact with a contact location of a semiconductor device that is created in a semiconductor substrate with said semiconductor substrate being underneath said first dielectric layer.

2. The method of claim 1, wherein depositing said conductive material in said via hole comprises selecting said conductive material with a conductivity smaller than conductivity of said conductive liner and depositing said selected conductive material in said via hole.

3. The method of claim 1, further comprising depositing a third dielectric layer on top of said one or more conductive paths and said second dielectric layer, wherein forming said via hole further comprises forming said via hole in said third dielectric layer and said second dielectric layer.

4. The method of claim 3, wherein forming said via hole further comprises forming a portion of said via hole in said third dielectric layer, said portion of said via hole in said third dielectric layer being at least as big as, and substantially overlap, said portion of said second dielectric layer remaining on top of said top surface of said conductive stud, such that said portion of said second dielectric layer remaining on top of said top surface of said conductive stud being substantially removed during forming said via hole.

5. The method of claim 1, wherein said conductive material used in filling said via hole is selected from a group consisting of tungsten (W), aluminum (Al), copper (Cu), and alloy thereof.

6. The method of claim 1, wherein said region on top of said top surface of said conductive stud has a lateral dimension less than a Blech length of said via made of said conductive material.

7. The method of claim 1, wherein said via is made of copper (Cu) and has a Blech length of around 10 micrometers.

8. The method of claim 1, wherein said via is made of conductive material selected from a group consisting of tungsten (W), aluminum (Al), copper (Cu), and alloy thereof.

9. The method of claim 1, wherein said conductive liner is made of a material being selected from a group consisting of titanium (Ti), tantalum (Ta), ruthenium (Ru), tungsten (W), titanium-nitride (TiN), tantalum-nitride (TaN), ruthenium nitride (RuN), and tungsten nitride (WN), and wherein said conductive liner being capable of preventing conductive materials from diffusing therethrough.

10. A method comprising:
    providing a first dielectric layer;
    forming a conductive stud inside said first dielectric layer;
    depositing a second dielectric layer on top of said first dielectric layer;
    forming one or more conductive paths inside said second dielectric layer after depositing said second dielectric layer, said one or more conductive paths being adjacent to a region of said second dielectric layer, said region of said second dielectric layer being on top of a top surface of said conductive stud;

removing said region of said second dielectric layer in forming a via hole, said via hole exposing said top surface of said conductive stud and exposing at least a portion of sidewalls of said one or more conductive paths;

depositing a conductive liner at a bottom and sidewalls of said via hole; and depositing a conductive material in said via hole forming a via, said via being in contact with said one or more conductive paths via said conductive liner.

11. The method of claim 10, wherein forming said conductive stud comprises forming said conductive stud on top of and being in contact with a contact location of a semiconductor device that is created in a semiconductor substrate with said semiconductor substrate being underneath said first dielectric layer.

12. The method of claim 10, wherein depositing said conductive material in said via hole comprises selecting said conductive material with a conductivity smaller than conductivity of said conductive liner and depositing said selected conductive material in said via hole.

13. The method of claim 10, further comprising depositing a third dielectric layer on top of said one or more conductive paths and said second dielectric layer, wherein forming said via hole further comprises forming said via hole in said third dielectric layer and said second dielectric layer.

14. The method of claim 13, wherein forming said via hole further comprises forming a portion of said via hole in said third dielectric layer, said portion of said via hole in said third dielectric layer being at least as big as, and substantially overlap, said portion of said second dielectric layer remaining on top of said top surface of said conductive stud, such that said portion of said second dielectric layer remaining on top of said top surface of said conductive stud being substantially removed during forming said via hole.

15. The method of claim 10, wherein said region on top of said top surface of said conductive stud has a lateral dimension less than a Blech length of said via made of said conductive material.

16. The method of claim 10, wherein said conductive liner is made of a material being selected from a group consisting of titanium (Ti), tantalum (Ta), ruthenium (Ru), tungsten (W), titanium-nitride (TiN), tantalum-nitride (TaN), ruthenium nitride (RuN), and tungsten nitride (WN), and wherein said conductive liner being capable of preventing conductive materials from diffusing therethrough.

17. A method comprising:

providing a first dielectric layer;

forming a conductive stud inside said first dielectric layer;

depositing a second dielectric layer on top of said first dielectric layer;

forming at least first and second conductive paths inside said second dielectric layer after depositing said second dielectric layer, said first and second conductive paths being separated by a region of said second dielectric layer, said region of said second dielectric layer being on top of a top surface of said conductive stud;

removing said region of said second dielectric layer in forming a via hole, said via hole exposing said top surface of said conductive stud and exposing at least a portion of sidewalls of both said first and second conductive paths;

depositing a conductive liner at a bottom and sidewalls of said via hole; and depositing a conductive material in said via hole forming a via, said via being in contact with said first and second conductive paths via said conductive liner.

18. The method of claim 17, wherein forming said conductive stud comprises forming said conductive stud on top of and being in contact with a contact location of a semiconductor device that is created in a semiconductor substrate with said semiconductor substrate being underneath said first dielectric layer.

19. The method of claim 17, wherein depositing said conductive material in said via hole comprises selecting said conductive material with a conductivity smaller than conductivity of said conductive liner and depositing said selected conductive material in said via hole.

* * * * *